United States Patent [19]

Tsukii

[11] Patent Number: 4,535,307
[45] Date of Patent: Aug. 13, 1985

[54] MICROWAVE CIRCUIT DEVICE PACKAGE

[76] Inventor: Toshikazu Tsukii, 89 Austin Rd., Sudbury, Mass. 01776

[21] Appl. No.: 393,961

[22] Filed: Jun. 30, 1982

[51] Int. Cl.³ ............................................... H01P 5/00
[52] U.S. Cl. .................................... 333/35; 324/58 A; 333/246; 333/247; 333/263
[58] Field of Search ............... 333/238, 246, 263, 247, 333/33, 35, 204, 205

[56] References Cited

U.S. PATENT DOCUMENTS

| | | | |
|---|---|---|---|
| 2,897,460 | 7/1959 | La Rosa | 333/263 X |
| 2,925,568 | 2/1960 | Baldwin | 333/263 X |
| 2,968,012 | 1/1961 | Alstadter | 333/246 X |
| 3,201,721 | 8/1965 | Voelcker | 333/33 |
| 3,697,902 | 10/1972 | Louvel | 333/246 |
| 3,775,644 | 11/1973 | Cotner et al. | 333/246 X |
| 3,849,745 | 11/1974 | Schellenberg et al. | 333/238 X |
| 3,925,740 | 12/1975 | Steensma | 333/238 X |
| 4,143,342 | 3/1979 | Cain et al. | 333/246 X |
| 4,383,227 | 5/1983 | de Ronde | 333/263 X |

Primary Examiner—Paul L. Gensler

[57] ABSTRACT

A microwave circuit device package including a conductive housing and selectively interchangeable transmission line sections each one thereof being disposable in such housing and means for tuning and matching the impedance of the disposed transmission line section to the impedance of a device connected thereto over a relatively wide frequency band of applied signals. Such tuning means includes a conductive member of predetermined dimensions slidably mounted in proximity to a selected conductor portion of one of such transmission line sections. Such transmission line sections include a straight continuous in-line configuration for high frequencies or serpentine strip conductor configurations for low and intermediate frequencies, each one of such serpentine strip conductor configurations defining a different acute angle relative to the conductive member. The microwave circuit housing is used to test, calibrate, evaluate or characterize the properties of the connected device over the wide frequency bandwidths.

14 Claims, 14 Drawing Figures

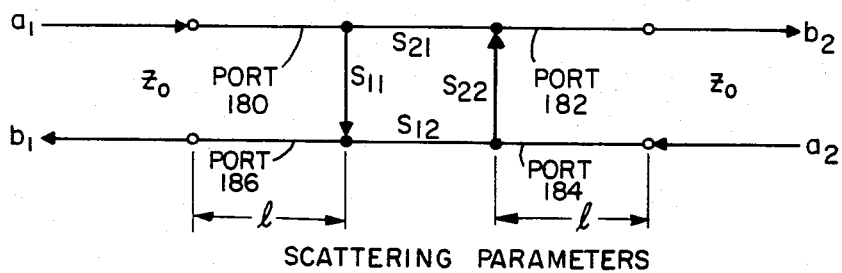
FIG. 4  SCATTERING PARAMETERS
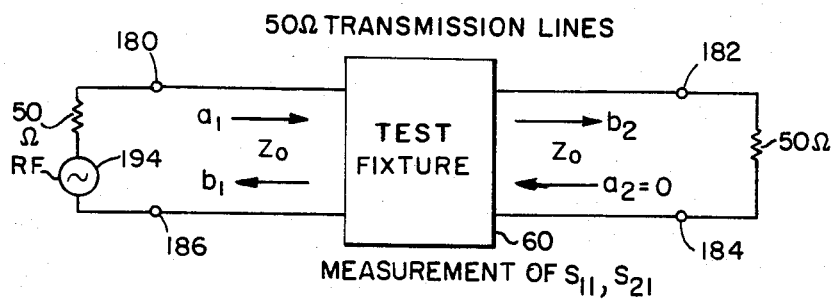
FIG. 5  MEASUREMENT OF $S_{11}, S_{21}$
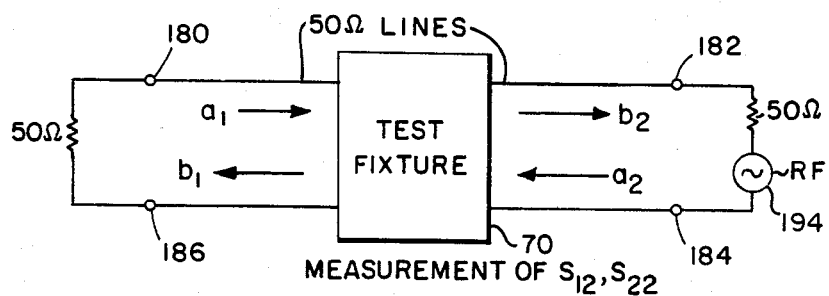
FIG. 6  MEASUREMENT OF $S_{12}, S_{22}$

MICROWAVE CIRCUIT DEVICE PACKAGE

BACKGROUND OF THE INVENTION

This invention relates generally to microwave circuits and more particularly to testing fixtures with tuning capabilities for characterization of microwave devices.

As is known in the art a technique for characterizing an electrical device such as a field effect transistor is the scattering parameter testing technique involving measurement of transmission and reflection coefficients including VSWR and impedance characteristics. The transmission lines employed in testing are required to provide specific conditions, for example, 50 ohm lines for scattering parameters measurements. A second characterization technique, the so-called power/gain measurement technique, requires that the impedance of the transmission lines feeding energy to a characterizing device be matched to the impedance of such device. Such techniques therefore, may employ numerous test fixtures, for example, a straight through calibration, an RF short, a bias T section DC block capacitor (bias T/DC block) and tuning. For example, to measure scattering parameters an RF short reference calibration and a straight through calibration are required to compensate for contribution to the scattering parameter measurement of the characterizing device by the length of the transmission lines coupled thereto. Further, for power/gain measurements, since the impedance of the transmission line is matched to the input impedance of the characterizing device, some tuning of the circuits feeding such a device is required. In addition, a source of a bias signal in general applied to such device must be isolated from the RF signals by use of a bias T section DC/block capacitor, for example. Thus these separate tests for performance measurements or calibration procedures may involve separate hardware requiring numerous connection and disconnection operations with attendant loss and mismatch problems, recalibration requirements and extremely lengthy structures with high insertion loss for wide bandwidths of operation. For example, with a 2 GHz–18 GHz frequency range wavelengths may vary from the high end to the low end by a factor of 9 to 1. Hence, for accurate tuning of a microwave circuit, the width of a one quarter wavelength tuner may be so wide as to be prohibitive and make it impossible to cover a particular portion of the frequency end where wavelengths are very short. This introduces a requirement for separate structures with multiple tuners to encompass a wide frequency range. In addition to the foregoing it has become difficult to provide a unitary relatively compact microwave multipurpose circuit device package for testing, evaluating, calibrating, and tuning, as well as filtering, generating or amplifying of microwave energy over wide bandwidths.

SUMMARY OF THE INVENTION

In accordance with the present invention a microwave circuit device package is provided including a conductive housing and interchangeable transmission line sections each one thereof being disposable within such housing. The impedance of the transmission line is varied by conductive tuning means having a width one quarter of a wavelength at the mid frequency of the highest band of frequencies to be covered, slidably disposed on the conductive housing in combination with a conductor of the transmission line. High frequency bandwidth transmission lines are provided with a continuous straight-through strip conductor configuration. Intermediate and low frequency bandwidth transmission lines are provided with a serpentine strip conductor configuration. The transmission line conductor for the intermediate and low frequency bands in each section define a different acute angle with respect to the conductive tuning means thereof. With such an arrangement, a single device package may be utilized for wide band characterization of a connected device without additional hardware or excessive connecting operations. Further, by using a serpentine configured strip conductor for intermediate and low frequency bands, a quarter wavelength tuner may still be used.

BRIEF DESCRIPTION OF THE DRAWINGS

The aforementioned and other features of the invention will become more apparent by reference to the following description taken together in conjunction with the accompanying drawings disclosing preferred embodiments of the invention wherein like reference numerals designate similar components throughout the following described views, in which:

FIG. 4 is a schematic circuit diagram of the scattering parameter technique;

FIG. 5 in a schematic circuit diagram of the scattering parameter technique for measuring the $S_{11}$ reflection coefficient and $S_{21}$ transmission coefficient;

FIG. 6 is a schematic circuit diagram of the $S_{12}$ transmission coefficient and $S_{22}$ reflection coefficient of the scattering parameter technique;

DESCRIPTION OF THE PREFERRED EMBODIMENT

Figure 1:
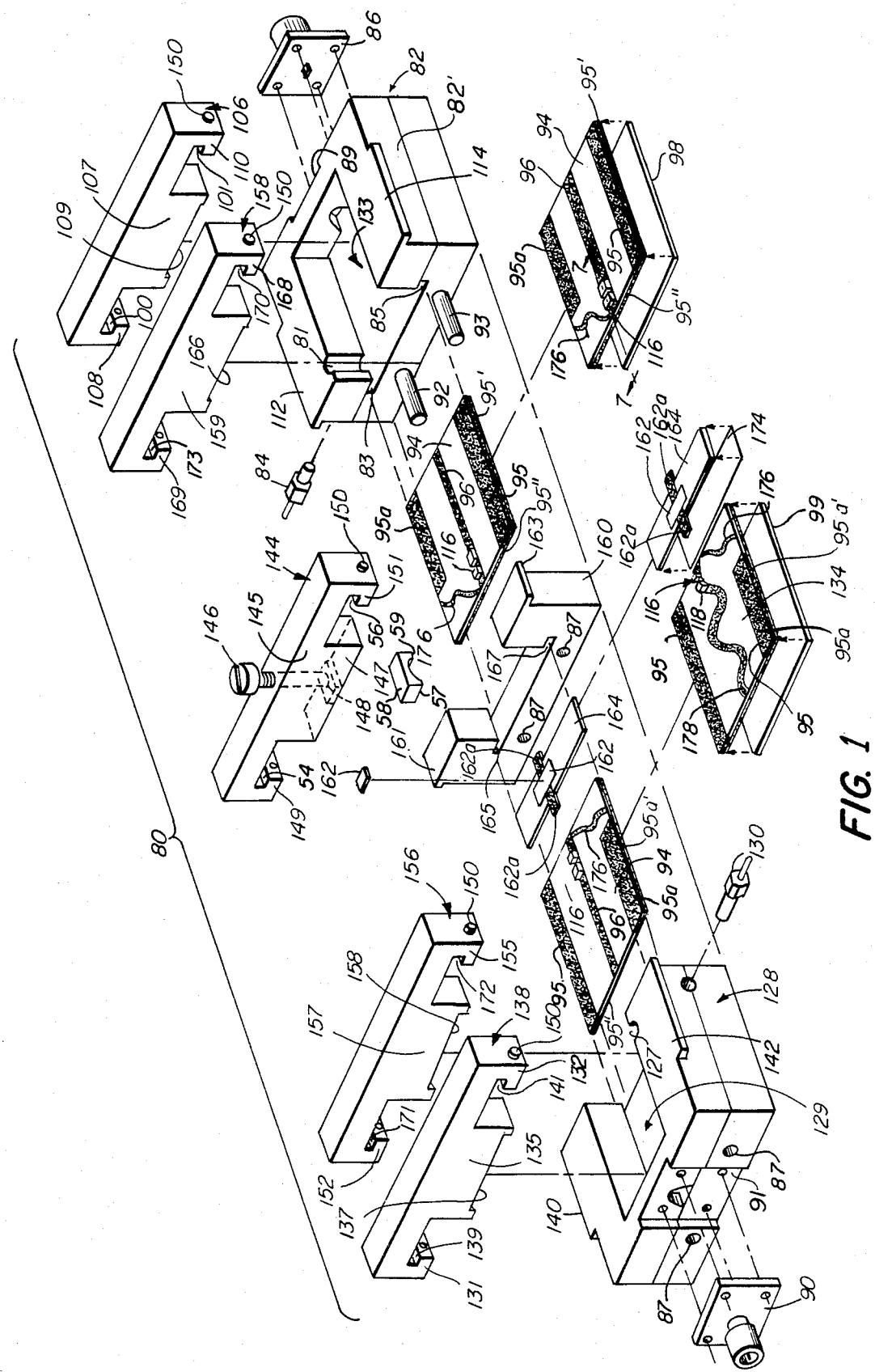
FIG. 1 is an exploded pictorial view of an embodiment of the invention, including an active solid state element for use in testing and characterizing thereof.
Figure 8:
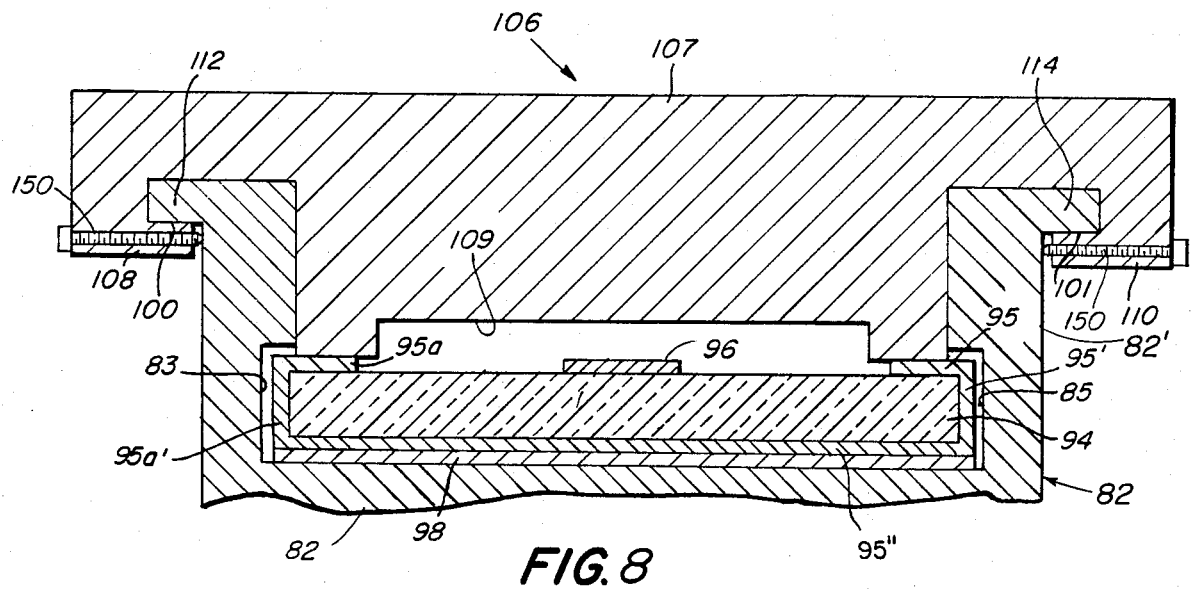
FIG. 8 is a partial enlarged fragmentary view of a step tuner, transmission line section and associated components along with the conductive housing and radio frequency contact structure as shown in FIGS. 1 and 2.
Figure 13:
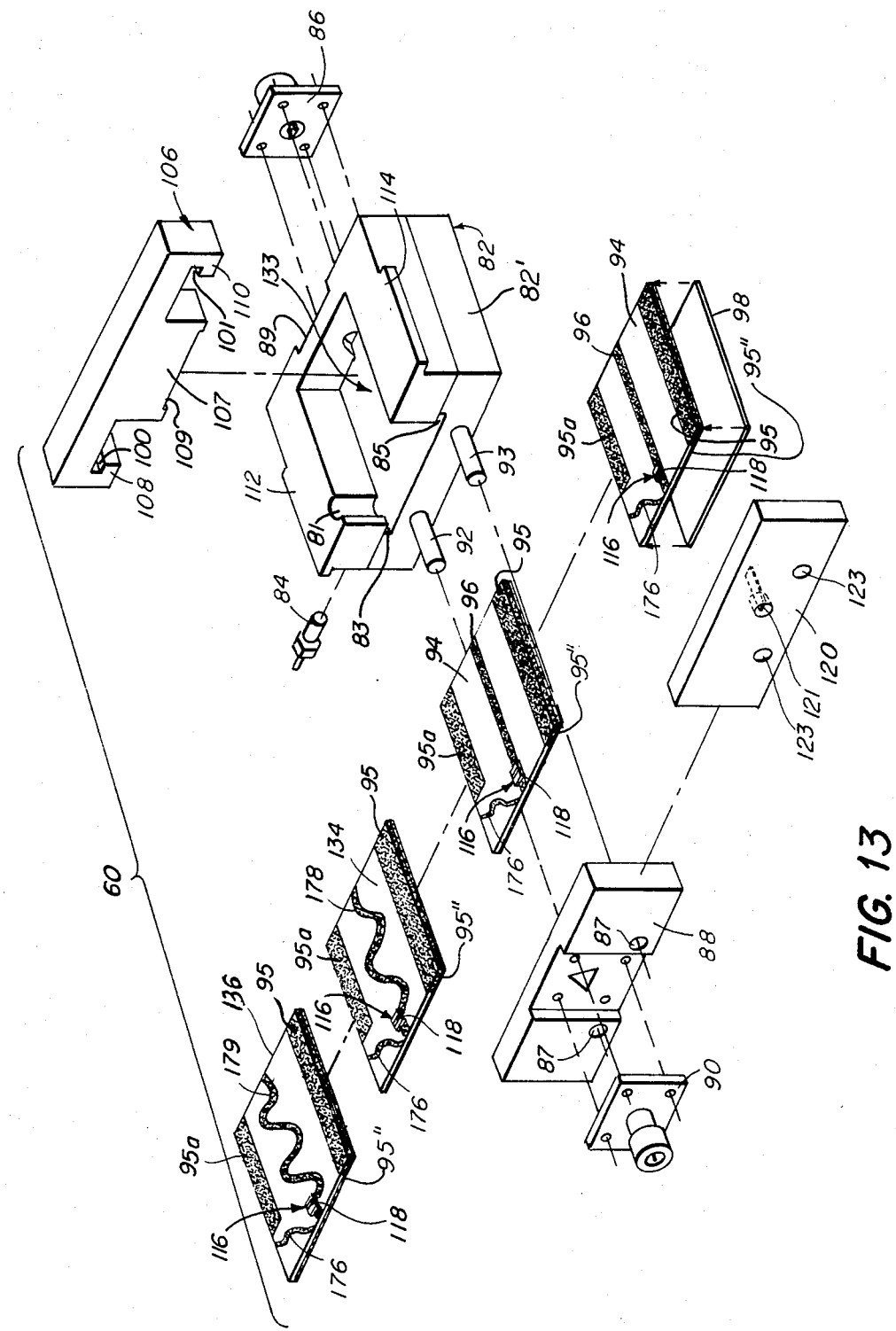
FIG. 13 is an exploded pictorial view of the embodiment for use as a test fixture, step tuner, radio frequency short or bias T/DC block referred to in FIGS. 1 and 12.
Figure 14:
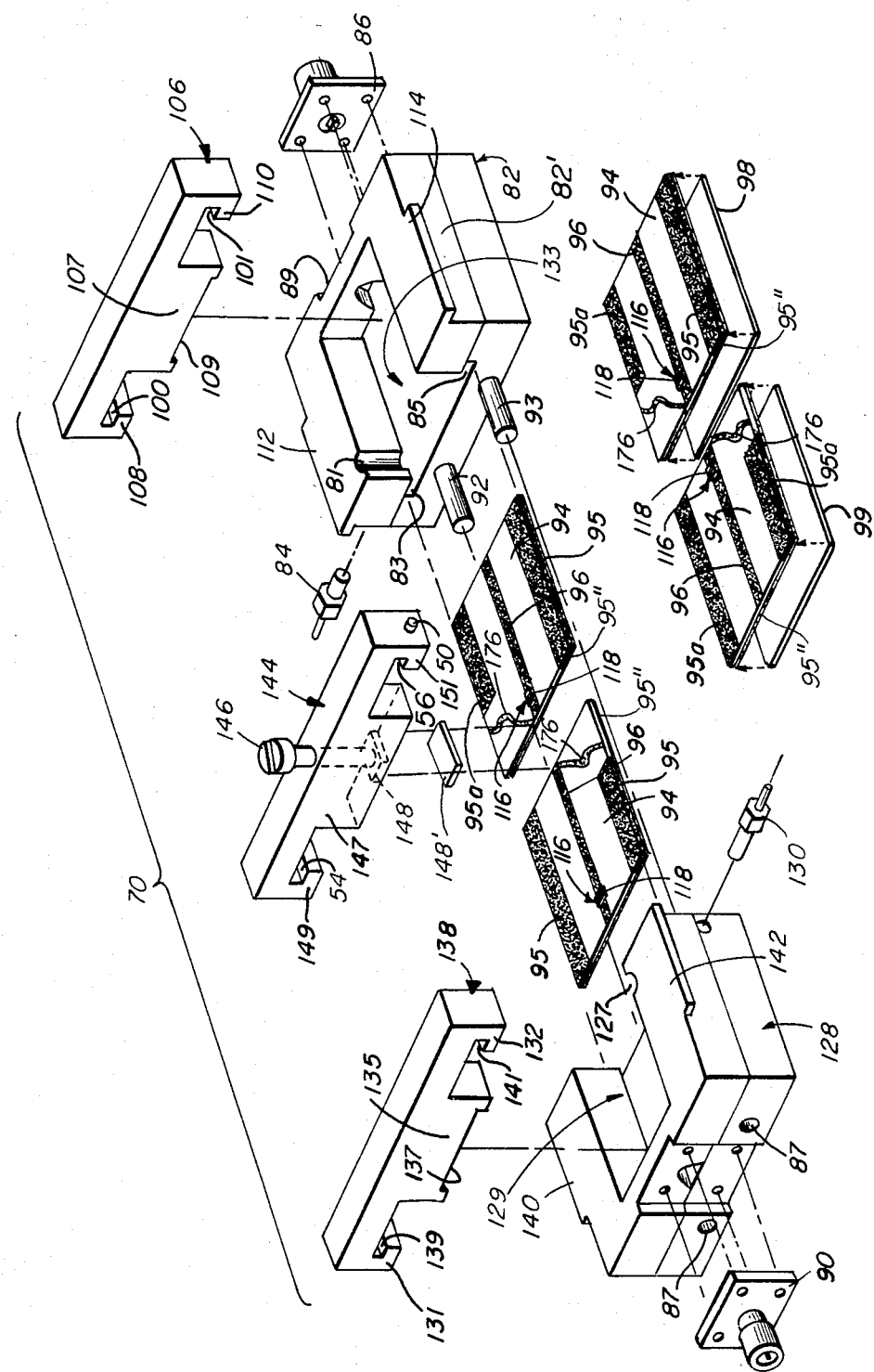
FIG. 14 is an exploded pictorial view of the embodiment for use in straight through calibration or step tuning in performing the tests enumerated in FIG. 3.

A. Circuit Device Package With Plural Interchangeable Transmission Line Sections Referring now to FIGS. 1 and 2 the embodiment 80 includes a first conductive housing 82, here of brass, having a coaxial transmission line energy launcher 86 connected to end wall 89, and a second conductive housing 128, here of brass, having a coaxial transmission line energy launcher 90 connected to end wall 91, as shown. Horizontal pins 92 and 93 provide for alignment with and engagement with, for example, apertures 87 in a shorting plate 88 (FIG. 13) or the second housing 128 (FIGS. 1 and 14). Conductive housing 128 in a similar manner as conductive housing 82 has fixed dimensions for substantially all embodiments of the invention when operated over a wide bandwidth of frequency. Radio frequency interference filter 84 extends within coaxial passage 81 in the housing 82 utilized for DC biasing to prevent RF energy from being coupled from the RF energy transmission lines to now be described. A substrate section 94, here of a dielectric material, has disposed thereon an in-line transmission line strip conductor 96 of a microstrip configuration here of chromium or gold plated copper configured for transmission over a frequency range of, for example, 12–18 Gigahertz. Disposed on a bottom portion thereof is a ground plane conductor 95″, here a chromium or gold plated copper. Metallized top strips 95, 95a, side strips 95′, 95a′ and ground plane conductor 95″ (see FIG. 8) are provided for RF continuity between housing 82 and a conductive tuning structure 106. The transmission line section 94 is preferably mounted on a conductive spacer 98 (FIGS. 1 and 8) here of brass, and is slidably disposed within housing 82 by means of insertion within opposed longitudinal slots 83 and 85 dimensioned to provide a press fit of the mounted section 94 and spacer 98.

In accordance with the teachings of the invention operation over a relatively wide bandwidth is attainable, for example, in the intermediate range of from 6–12 GHz or low frequency range of from 2–6 GHz by a serpentine strip conductor 178 (FIGS. 1, 10 and 13) shown on section 134 or a serpentine strip conductor 179 (FIGS. 11 and 13) shown on section 136. It will be noted that all the transmission line sections both inline strip conductor 96 and serpentine strip conductors 178 and 179 configurations are adapted for interchangeable mounting within housings 82 and 128 in any desired combination. Combining a serpentine line 178 having a frequency range of 6 to 12 GHz and straight line 96 covering 12–18 GHz provides for matching of impedances between 6 and 18 GHz by combination of such lines. The transmission line sections all have substantially the same dimensions and provide in a small package for the bandwidths ratios which would require up to 9:1 overall changes in length in prior art embodiments. Such longer lengths for achieving lower frequencies tend to introduce insertion losses making impedance matching and in general characterization more difficult.

Each conductive housing 82 or 128 (FIG. 1 and 14) supporting one of such transmission line sections 94, 134 or 136 are disposed within hollow portions 133 or 129, respectively, of such housings. The output energy couplers 86 and 90 are secured to end walls 89 and 91 respectively. Housing 128 provides for alignment and connection to pins 92, 93 of housing 82. All the interchangeable line sections, housings and other appurtenant structures are assembled without bonding and with minimal networks.

Figure 7:
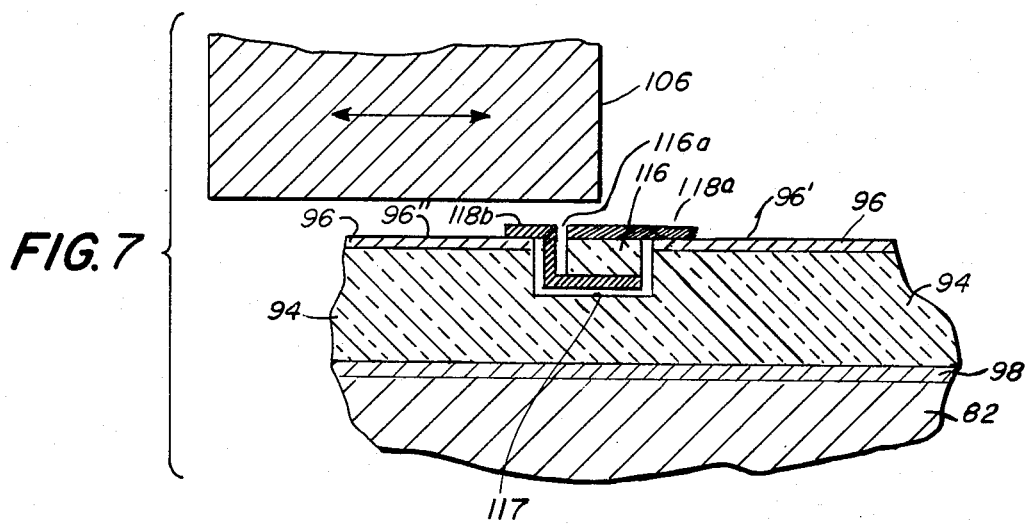
FIG. 7 is a partial diagrammatic view of the DC blocking capacitor, step tuner and transmission line components for use in the preferred embodiment shown in FIGS. 1 and 2.

Additional components to the microwave circuit package include a blocking capacitor 116 here a beam lead capacitor (FIG. 7) recessed within a channel 117 (FIG. 7) formed in the substrate 94 and a strip conductor 96 formed on the top portion of the substrate 94. One of such beam leads 118a is secured by thermocompression to a portion 96′ of the strip conductor 96 and a second one of such beam leads 118b is thermocompression bonded to a portion 96″ of the strip conductor 96 to provide a split at a point 116a so that capacitor 116 is coupled in series electrically with strip conductor 96. The capacitor 116 blocks DC biasing to an active solid state device 162 (FIG. 1) such as a field effect transistor to be hereinafter described. The shunted high impedance transmission line 176 provides for DC biasing to an active device. The end of biasing lines 176 contact the inner ends of RF interference filters 84, 130 in housings 82, 128 (FIGS. 1, 13 and 14). Such RF filter means prevent microwave energy from being coupled from the transmission lines 96, 178 or 179.

Figure 2:
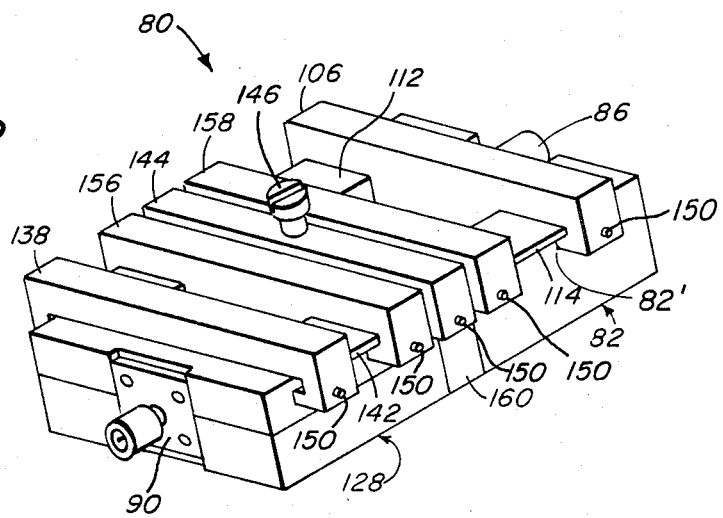
FIG. 2 is an isometric view of the assembled circuit device package having the components illustrated in FIG. 1.

The embodiment 80 shown in FIGS. 1 and 2 incorporating in tandem either plural transmission line sections 96 or a straight line section 96 and serpentine line 178 or 179 has disposed therebetween an active solid state element 162, such as a field effect transistor (FET) positioned on a substrate 164 and mounted on a holder 160. Device holder 160 has apertures 87 for alignment with pins 92, 93 in housing 82 and similar apertures 87 in housing 128. Protrusions 161, 163 on holder 160 are aligned with similar structure on housings 82, 128 for assembly of the complete device as shown in FIG. 2. Grooves 165, 167 engage substrate 164 and conductive spacer 174 to maintain the solid state device 162 in alignment with line 96. A conductive contact holding member 144 has L-shaped portions 149 and 151 having grooves 54 and 56 therein for engaging protrusions 161, 163 of device holder 160 to interlock the assembled components by means of a screw 150, as shown in FIG. 2. A screw 146 (FIG. 1) in contact holder 144 extends axially within a central portion 145 of conductive housing holding member 144 to maintain under pressure a plastic plate 148. Plastic plate 148 engages a plastic arch-shaped contactor 58 placing a variable force component on leads 162a extending laterally from device 162 to engage with the terminal ends of lines 96 and the DC biasing lines 176 to energize the active device 162. The arch shape of contactor 58 provides bifurcated sections 57 and 59 to engage the DC biasing lines 176 and provide electrical continuity.

B. Tuning Structure

Referring now to FIGS. 1, 2, 8, 13 and 14 with each of the foregoing transmission line sections 94, 134, 136 covering predetermined frequency ranges, impedance matching between the impedance of the microstrip transmission line sections 94, 134, 136 (FIG. 13) and the impedance of the active device 162 is accomplished by a first conductive tuning member 106, adapted for slidably traversing the transmission line strip conductors 96, 178, 179 disposed within housing 82. Such tuner 106 has a central portion 107 defining a recess 109 positioned and spaced with respect to the strip conductors 96, for example. The enlarged central portion 107 of tuning member 106 is disposed within the hollow portion 133 of housing 82 and substantially L-shaped body portions 108 and 110 with grooves 100 and 101 slidably engage protrusions 112 and 114 defined by the housing 82. Screw means 150 (FIG. 1) secure tuner 106 to the housing body walls 82'. The tuner disposition overhead to match the line impedances is made possible by means of RF continuity with the housings 82. Metallized top strips 95 and 95a (FIG. 8) on dielectric substrate 94, side strips 95' and 95a' and bottom strip 95" and conductive spacers 98 or 99 provide for conductive contact of the frequency member 116 with the conductive housing 82 and ground plane conductor 95" of the transmission line section 94. The tuner 106, in combination with the dielectric medium (air) (FIG. 8) between strip conductor 96 and tuner wall portion 109 (FIG. 8), acts as a common ground plane conductor and supercedes and overides the normal microstrip line characteristics of the transmission line section 94 when the ground plane conductor is disposed below the dielectric medium. Such an arrangement is sometimes referred to in the art as "inverted" microstrip line.

In FIGS. 1, 2 and 14 a plurality of tuners 138, 156, 158 having, respectively, additional L-shaped sections 131, 132; 152, 155; and 168, 169 with grooves 139, 141; 171, 172; and 170, 173 engage lateral protrusions 112, 114 in housing 82 and similar structure 140, 142 in housing 128 are added to the embodiment 80 to provide impedance matching of selected ones of transmission line sections 94, 178, 179 in combination with tuner 106 (FIG. 13).

C. Characterization Testing Technique

Referring now to FIGS. 3-6, inclusive, testing techniques of solid state devices, such as scattering parameter and power/gain measurements will now be described. A method of deriving the device characterization involves scattering parameter measurements such as the reflection coefficients $S_{11}$, $S_{22}$ and the transmission coefficients $S_{12}$, $S_{21}$ of linear two port network circuits (FIG. 4) is schematically delineated by dotted line 10 in the upper half of FIG. 3. The scattering parameters are measured with respect to the characteristic impedance of the system, here 50 ohms, as shown in FIGS. 5 and 6. Reflection coefficients $S_{11}$, $S_{22}$ are related to the VSWR and impedance of the input and outputs of the FET 162 and are the ratios of reflected and incident powers. Transmission coefficients $S_{12}$, $S_{21}$ characterize gain or attenuation measurements of the device.

In accordance with the invention a unitary circuit device package 60 (FIG. 13), 70 (FIG. 14) or 80 (FIG. 1) is employed for measurement of all scattering parameters. Normally a testing fixture 12 is required for the device and a testing fixture 14 (FIG. 3) for the RF short or reference calibration are required as standards for the reflection coefficients $S_{11}$, $S_{22}$. Similarly, a testing fixture 16 is required as a standard for straight through tests to establish the transmission coefficients $S_{12}$, $S_{21}$. The dotted line delineated as 80 represents the multiple purpose device circuit package shown in FIG. 1 having the active element 162 for use as test fixture 12. A testing fixture 14 for the RF short test requires a shorting plate 120 and is shown in FIG. 13 and designated as embodiment 60. Such fixture 14 is employed for calibration test 18 with a connected device to launcher 86. Similarly, straight through testing fixture 16, for calibration tests 20 of $S_{21}$ and $S_{12}$ is derived from the the embodiment 70 by adaptations of dual housing, transmission line sections and plural tuners as shown in FIG. 14.

In FIG. 4 the scattering parameters are detailed using the convention that "a" is a signal into a port 180 and "b" a signal out of a port 182. In this drawing "a" and "b" are square roots of power; $(a_1)^2$ is the power incident at port 180, and $(b_2)^2$ is the power leaving port 182. The fraction of "a", that is reflected at port 180 is $S_{11}$ and the portion that is transmitted at port 182 is $S_{21}$. Similarly, the fraction of "$a_2$" that is reflected at port 184 is $S_{22}$ and $S_{12}$ is the portion that is transmitted at port 186 in the reverse direction. The signal "$b_1$" leaving port 186 is the sum of the fraction of "$a_1$" that was reflected at port 180 and what was transmitted from port 182. The outputs related to the inputs are:

$b_1 = S_{11}a_1 + S_{12}a_2$ $b_2 = S_{21}a_1 + S_{22}a_2$

The setup for the technique for measuring $S_{11}$ and $S_{21}$ coefficients is shown in FIG. 5. The test fixture 60 (FIG. 13) is fed by an RF power source 194 having a source impedance, here 50 ohms. The test fixture 60 and RF source 194 are coupled together through a 50-ohm transmission line network. For the RF short measurement, if $a_2=0$, then: $S_{11}=b_1/a_1$, $S_{21}=b_2/a_1$ where the 50-ohm transmission lines extend from opposing sides of test fixture 60 with the RF source 194 connected as at 180, 186. Similarly, the setup for measuring $S_{12}$ and $S_{22}$ is shown in FIG. 6.

If $a_1=0$, then: $S_{12}=b_1/a_2$, $S_{22}=b_2a_2$.

Having measured the contributions of the package 80, and in particular the transmission lines 94, for example, measurements are then made for $S_{11}$, $S_{22}$ and $S_{12}$, $S_{21}$ with the device mounted in the fixture as shown in FIG. 1. The adduced data is then analyzed with the contribution of the package to $S_{11}$, $S_{22}$ and $S_{12}$, $S_{21}$ removed from the measurements taken with the device mounted in the fixture as shown in FIG. 1.

Another advantage of the scattering parameter measurement technique is that the coefficients, being vector quantities, contain both magnitude and phase information. Further detailed information on scattering measurement techniques may be obtained from the text entitled, "Microwave Filters, Impedance-Matching Networks, and Coupling Structures", Matthaei, Young & Jones, McGraw Hill Book Company, pps. 42–45, inclusive.

In accordance with an additional aspect of the present invention, the fixture 80 is employed to measure power/gain characteristics of the device.

Figure 3:
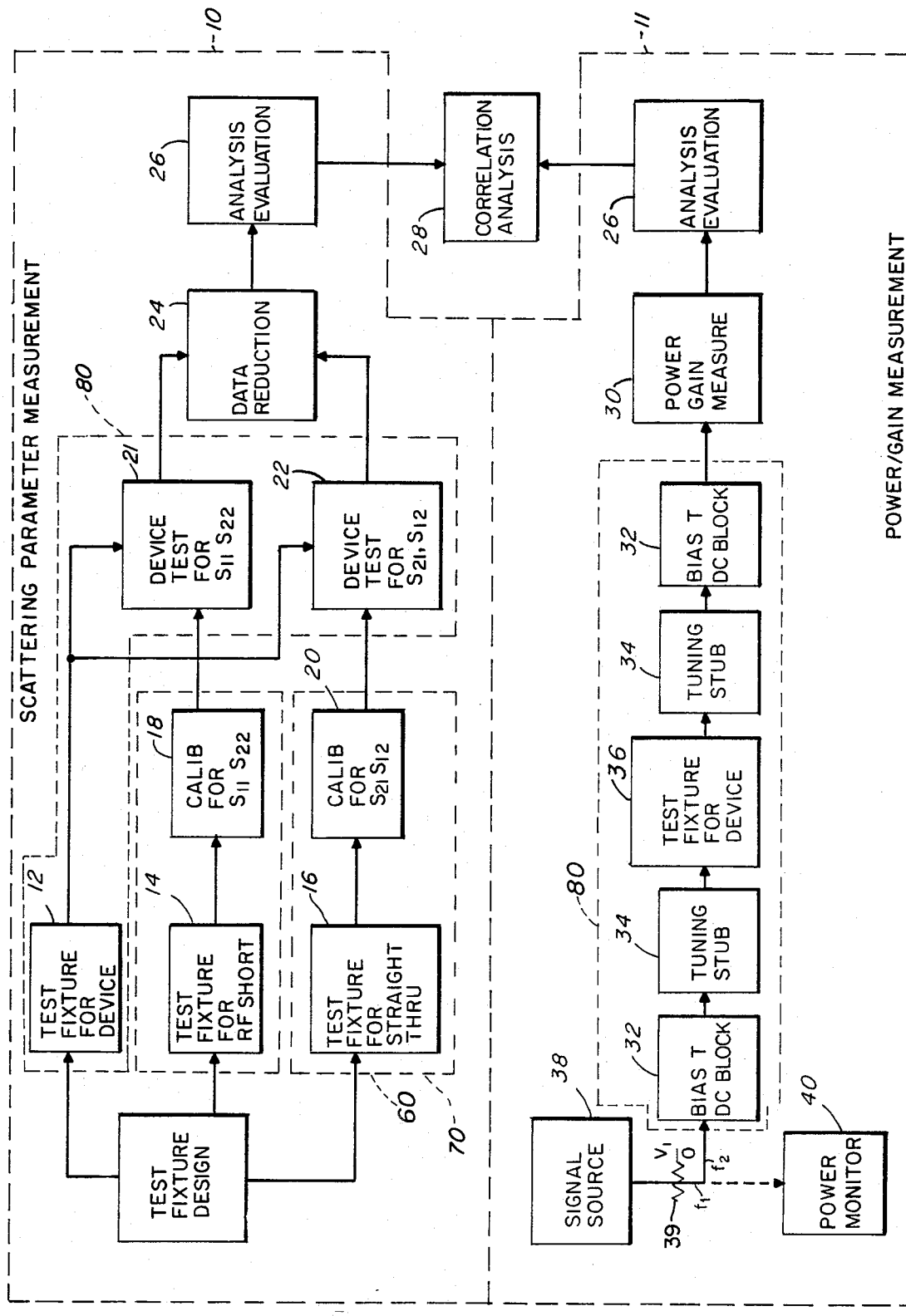
FIG. 3 is a block diagram of two methods of testing solid state devices, including reflection and transmission coefficient or scattering parameter measurements and power-gain measurements, using the embodiment of FIG. 1.

Typical power/gain measurement techniques delineated by dotted line 11 in FIG. 3 are accomplished by tuning such circuits for maximum power/gain with narrow band tuning apparatus 34 for the input and output of testing fixture 36 for the device. Tuning apparatus 34 of the package 80 is here provided by selective positioning of the slidable tuning members 106, 138, 156, 158 (FIG. 1) along the conductive housings 82, 128, providing a characteristic impedance of such section of inverted transmission line formed from the tuning member and thus, in combination with the characteristic impedance of the transmission line and device, the overall characteristic impedance of the system. In general, the tuning member has a width (d) substantially equal to a quarter of a wavelength of the highest in-band frequency for in-line transmission line configuration 94.

Figure 11:
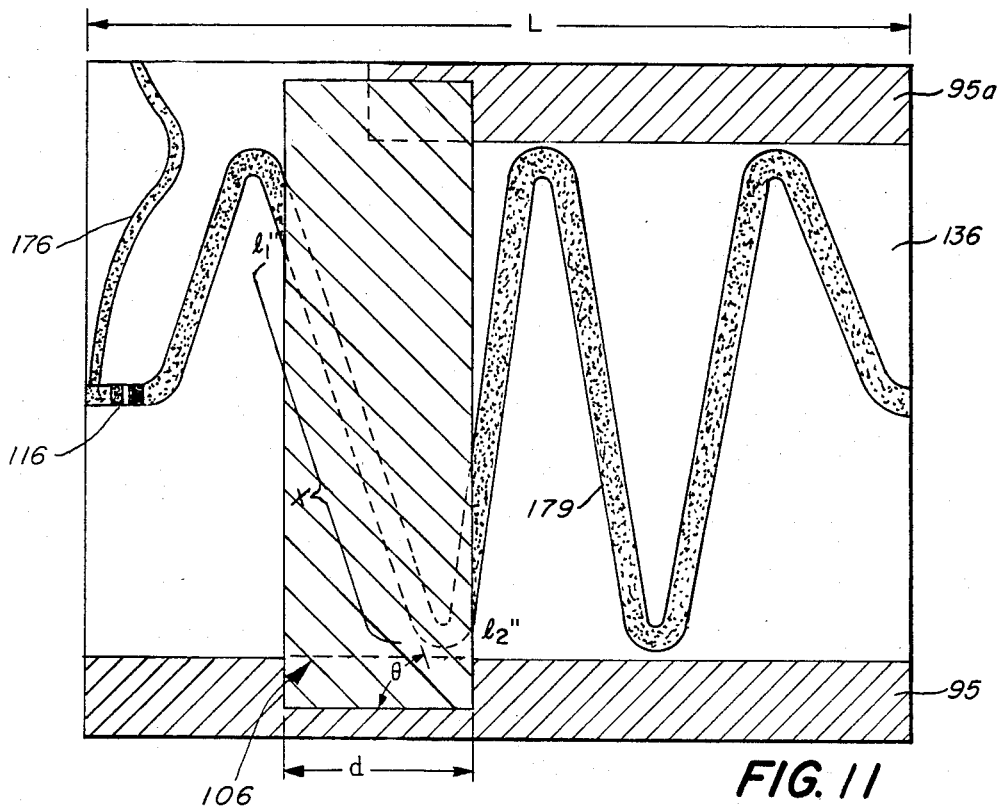
FIGS. 9, 10 and 11 are plan views of alternative straight through and serpentine transmission line sections and tuners to cover relatively wide bandwidths.
Figure 10:
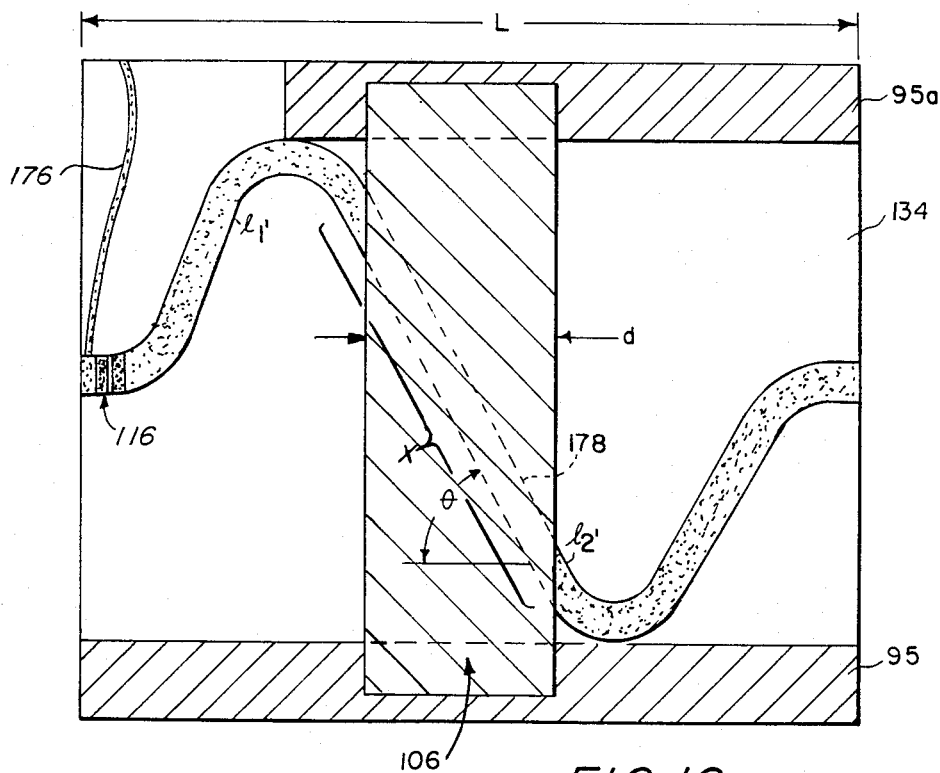

For serpentine configurations 178, 179 the tuning member traverses a distance defined as $x = d/\cos\theta$ where $\theta$ is the acute angle between the serpentine strip conductor and the tuning member (see FIGS. 10, 11). For a system where the tuning apparatus is traversed by a $\lambda/4$ tuning member, the characteristic impedance $Z_1$ thereof is related to the system impedance $Z_0$ and device impedance $Z_2$ as $Z_1 = \sqrt{Z_0 Z_2}$. Thus, the tuning member is adjusted until $Z_1 = \sqrt{Z_0 Z_2}$. In certain applications where there is a large difference between $Z_0$ and $Z_2$, it might not be possible to tune such a circuit with one tuning member 106. Here a second member 158 is provided to further tune such circuit in a similar manner as described above. Signal source 38 and power monitor 40 provide a sawtoothwaveform 39 periodically linearly varying from zero to $V_1$ over a range of frequencies $f_1$ to $f_2$ that is fed to bias T section DC block capacitor (bias T/DC block) 32. Bias T/DC block 32 is followed by tuner 34 feeding the device 36. A second tuner 34 and a second bias T/DC block 32 follow. The data obtained during power gain measurement 30 is analyzed and evaluated during analysis evaluation 26. This information is available for correlation analysis 28 along with the scattering parameter characterization data from analysis evaluation 26. Here the conductive housings 82, 128 have fixed dimensions and tuning members 106, 138, 156, 158 and interchangeable transmission line sections 94, 134 are of substantially similar length and width, here microstrip conductor line configuration, resulting in a compact size microwave circuit device package. The serpentine strip conductor lines 178, 179 provided herein define different acute angles $\theta$ with respect to the conductive tuning means to yield varying bandwidths over a relatively wide overall frequency range. The transmission line impedances are matched to the interconnected solid state device being tested and characterized, when tuning with the tuning members, to provide substantially constant impedance lines such as 50 ohm input and output lines for such tests as scattering parameter tests described with reference to FIGS. 5 and 6.

Figure 9:
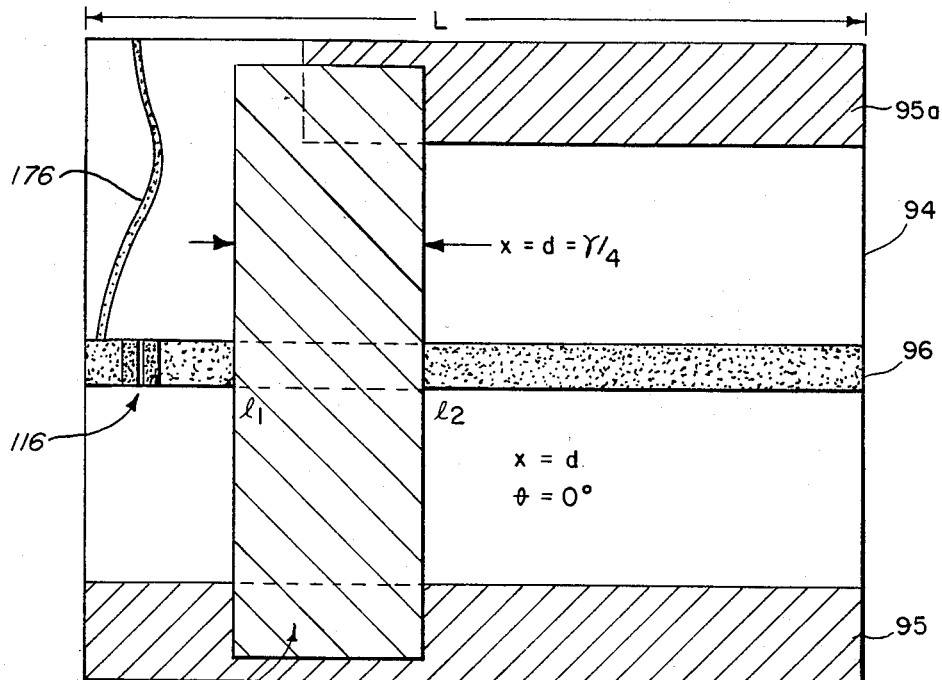

Referring now to FIG. 9, a substrate 94 having a straight through continuous in-line strip conductor portion 96 is configured for use in device characterization (FIG. 1), RF short testing (FIG. 13) of reflection coefficients (14, 18, 21 FIG. 3), and/or straight through testing or tandem arrangments with even wider bandwidths (FIG. 14) and transmission coefficient scattering parameter tests (16, 20, 22 FIG. 3). The slidable conductive tuner 106 (FIGS. 9, 10, 11 and 13) has a width "d" approximately one quarter of a wavelength at the mid frequency of the high band of coverage desired. Such dimension is indicated between points $l_1$ and $l_2$ and movement of tuner 106 parallel to the strip conductor 96 traverses one quarter of the bandwidth for each tuning cycle. Metallized strips 95, 95a are deposited on the upper surface of substrate section 94 having a fixed overall length (L) as was described in conjunction with FIG. 8. Continuous in-line conductor 96 will provide coverage of relative short wavelength such as over a frequency range of 12 to 18 GHz. Tuner 106 traverses a perpendicular path relative to transmission line conductor 96 and, therefore, the angle $\theta = 0°$. For intermediate and lower frequency embodiments having longer wavelengths and attendant higher insertion losses, a serpentine transmission line 178 (FIG. 10) or 179 (FIG. 11) provided on small substrate sections 134, 136, respectively, define an acute angle $\theta$ relative to the overhead tuner path movement. Angle $\theta$ is derived from cosine $\theta = d/x$ where d = tuner width; and x = the distance along the slope of transmission line conductors 178 or 179 traversed by tuner 106. In FIG. 10 a bandwidth of 6–12 GH$_z$ is covered and FIG. 11 spans the 2–6 GH$_2$ range or low end of the band with extremely long wavelengths.

Combinations of substrate sections 94, 134, 136 singly or in tandem thus provide any various desired frequency ranges and single or dual housings may be employed along with any desired number of tuners to further extend such frequency ranges. In some instances, such as the bias T/DC block configuration shown in block diagram (FIG. 3) which provides testing capabilities enumerated by blocks 32, as well as, the RF short fixture in FIG. 13 for reflection coefficient measurements, the tuner may be omitted. In FIGS. 1, 2 and 14, embodiments 70, 80, plural overhead tuners, 106, 138, 156 or 158 provide for testing the devices and straight through transmission coefficient testing defined in block diagram (FIG. 3), portion 10. Very wide frequency ranges, as well as varied multipurpose functions in testing device (FETs), generating or amplifying microwave energy with unitary compact packaging may be realized in carrying out the teachings of the present invention with minimal mechanical assembly steps and fewer electrical interconnections of critical components, such as biasing networks. Lower insertion loss characteristics and fewer impedance matching discrepancies will result from the disclosed unitary compact packages.

D. Alternative Testing Fixture Embodiments

Figure 12:
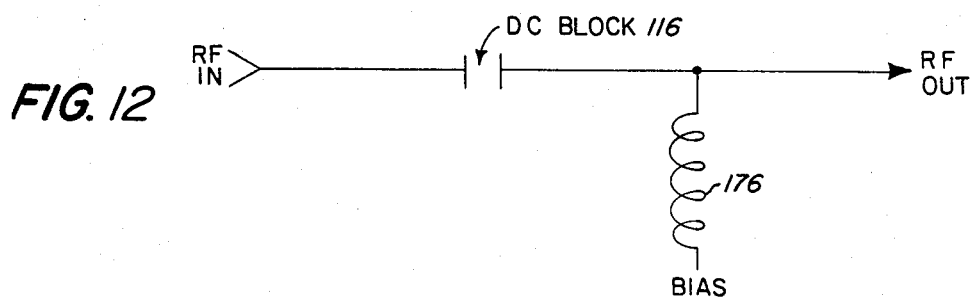
FIG. 12 is a schematic circuit diagram of a bias T/DC block for performing the characterizing and evaluation test enumerated in FIG. 3.

FIG. 12 illustrates schematically a bias T/DC block arrangement for use in power gain measurement tests. This circuit can be implemented by the package 60 shown in FIG. 13. Here plate 88 encloses the end of housing 82 and chamber 133. The shunted high impedance DC biasing line is indicated as 176 and contacts, for example, RF interference filter 84. The DC block includes capacitor 116 as shown and described in connection with FIG. 7. RF energy from, for example, an antenna (not shown) is connected to the test fixture by input coupler 86. Such energy is fed to a receiver (not shown) by means of a coaxial transmission line (not shown) connected to launcher 90. For such bias T/DC block embodiments the tuner 106 slidably disposed overhead is omitted.

In FIG. 13 an RF short fixture 14 (FIG. 3) for reflection coefficient $S_{11}$, $S_{22}$ test in shown provided simply by shorting housing 82 and chamber 133, by means of shorting plate 120 substituted for plate 88 used to provide the bias T/DC block. A tab 121 is provided internally by the shorting plate 120 for electrically contacting conductor 96 of the transmission line and hence shorting such conductor 96 to ground. Apertures 123 are provided for alignment of pins 92, 93 in housing 82.

In FIG. 14 another test fixture for straight calibration measurement of transmission coefficients $S_{21}$ and $S_{12}$ (FIG. 3) is disclosed. Such embodiment 70 comprises an additional conductive housing 128 including RF interference filter 130. Plural interchangeable substrate sections 94 with transmission line conductor 96, DC blocking capacitor 116 and strips 95, 95a are disposed in chambers 129, 133. Spacers 98, 99 contact substrate sections 94. A contact member 144 having a central portion 147 thereof and threaded holding means 146 is disposed intermediate the ends of tranmission lines 96.

L-shaped sections 149, 151 define grooves 54 and 56 engage protrusions 112 and 114 in housing 82 and straddle similar protrusions 140, 142 in the second housing 128. Screw 150 holds contact member 144 in its desired position. A plate 148 here of a plastic material engages a second plate 148' of a conductive material to engage and contact the underlying ends of transmission lines 96 in the end to end tandem arrangement to define a straight through transmission line. Pressure exerted by screw means 146 will provide for electrical integrity between the transmission lines and plate 148'. Combining two boards each having a 12–18 $GH_z$ range can now yield a 6–18 $GH_z$ range in the continuous straight through in-line configuration where the overall line length is effectively doubled. As shown in FIG. 1 it is also within the precepts of the invention to combine straight in-line with serpentine configurations such as lines 96, 178, 179 on substrates 134, 136.

An additional tuner 138 can also be incorporated with the second transmission line section in housing 128. Such tuner is disposed overhead and comprises L-shaped sections 131, 132 with grooves 139, 141 engaging protrusions 140, 142. Central portion 135, 157, 159 with recessed walls 137, 158 and 166 function as ground plane conductors under the so-called inverted microstrip line configuration referred to in connection tuner 106 in FIG. 8. Shunted high impedance transmission line 176 contacting RF interference filter means 84, 130 permit DC biasing of devices where incorporated with such DC bias introduced through passageways 81, 127 in housings 82, 128. Plural tuners 106, 138 (FIG. 14) also provide for employment of the microwave circuit device package for testing a device electrically connected to launcher 86 and the embodiment 70 becomes a tuned filter with output RF energy coupled from launcher 90.

Having thus described preferred embodiments of the invention, it is evident that other modifications or alternative embodiments incorporating these teachings may be practiced. It is desired, therefore, that the invention not be restricted to the disclosed embodiments but rather be limited only by the spirit and scope of the invention in accordance with the appended claims.

What is claimed is:

1. A microwave circuit device package comprising:
a conductive housing;
a transmission line disposed in said housing comprising:
 (i) a dielectric substrate having a pair of opposing surfaces;
 (ii) a strip conductor disposed on a first one of the pair of surfaces;
 (iii) a ground plane conductor disposed on a second one of the pair of surfaces; and
a slidable tuner means for adjusting the impedance of said transmission line, said tuner means including a conductive member carried by said housing and arranged to slidably traverse only over an exposed surface portion of the strip conductor portion of the transmission line.

2. The microwave circuit as recited in claim 1 wherein said ground plane conductor of said transmission line includes portions disposed on a pair of opposing edge portions of the substrate and portions of the first one of the pair of opposing surfaces of the substrate adjacent said pair of edge portions.

3. The microwave circuit device package as recited in claim 1 wherein said transmission line comprises a continuous straight-through in-line conductor disposed orthogonally to said conductive member.

4. The microwave circuit device package as recited in claim 3, wherein said conductive member has a width approximately equal to one-quarter of a wavelength of the corresponding mid frequency of the highest band of operation.

5. The microwave circuit device package as recited in claim 3 wherein said conductive member is a first member and said tuner means further comprises a plurality of slidable conductive members carried by said housing and operatively associated with said transmission line.

6. The microwave circuit device package as recited in claim 3 wherein said housing is a first conductive housing and said transmission line is a first transmission line, said package further comprising:
a second conductive housing;
a second transmission line disposed in said second conductive housing comprising:
 (i) a dielectric substrate having a pair of opposing surfaces;
 (ii) a strip conductor disposed on a first one of the pair of surfaces;
 (iii) a ground plane conductor disposed on a second one of the pair of surfaces;
a slidable tuner means for adjusting the impedance of said transmission line, said tuner means including a conductive member carried by said second housing and arranged to slidably traverse the strip conductor portion of the second transmission line; and
a solid state microwave device disposed intermediate adjacent ends of said transmission lines.

7. The microwave circuit device package as recited in claim 6 further comprising:
direct current-biasing means for providing a bias signal to the solid-state device comprising:
a shunted high impedance transmission line electrically associated with a first one of said first and second transmission lines; and
a direct current blocking capacitor means electrically connected in series with said first one of the transmission lines.

8. The microwave circuit device package as recited in claim 1, wherein said transmission line comprises a serpentine conductor configuration defining an acute angle with respect to said conductive member.

9. The microwave circuit device package as recited in claim 3, wherein said conductive member traverses a portion of the strip conductor approximately equal to one-quarter of a wavelength.

10. The microwave circuit device package as recited in claim 8 wherein said conductive member is a first member and said tuner means further comprises a plurality of slidable conductive members carried by said housing operatively associated with such transmission line.

11. A microwave circuit device package as recited in claim 8 further comprising:
a second conductive housing with a transmission line therein including a strip conductor on a dielectric substrate, orientated in tandem with said first conductive housing.

12. A microwave circuit device package as recited in claim 11 further comprising:
a solid state microwave device disposed intermediate adjacent ends of said transmission lines.

13. The microwave circuit device package as recited in claim 12 further comprising:
direct current-biasing means for providing a bias signal to the solid-state device comprising:

a shunted high impedance transmission line electrically associated with said transmission line; and a direct current blocking capacitor means electrically connected in series with the transmission line.

14. A microwave circuit device package comprising:

a conductive housing;

a transmission line disposed in said housing comprising:
   (i) a dielectric substrate having a pair of opposing surfaces;
   (ii) a serpentine strip conductor disposed on a first one of the pair of surfaces;
   (iii) a ground plane conductor disposed on a second one of the pair of surfaces; and a slidable tuner means for adjusting the impedance of said transmission line, said tuner means including a conductive member carried by said housing and arranged to slidably traverse the serpentine strip conductor portion of the transmission line, wherein said conductive member traverses a portion of the serpentine strip conductor approximately equal to one-quarter of a wavelength.

* * * * *